United States Patent
Janssens et al.

(10) Patent No.: US 9,466,941 B2
(45) Date of Patent: Oct. 11, 2016

(54) PATTERNED RETARDER AND OPTICAL ENGINE FOR LASER PROJECTION APPARATUS

(71) Applicant: Barco NV, Kortrijk (BE)

(72) Inventors: Peter Janssens, Ghent (BE); Koenraad Vermeirsch, Bellegem (BE)

(*) Notice: Subject to any disclaimer, the term of this patent is extended or adjusted under 35 U.S.C. 154(b) by 589 days.

(21) Appl. No.: 13/841,804

(22) Filed: Mar. 15, 2013

(65) Prior Publication Data
US 2014/0036943 A1 Feb. 6, 2014

Related U.S. Application Data

(60) Provisional application No. 61/678,012, filed on Jul. 31, 2012.

(51) Int. Cl.
*G02B 27/28* (2006.01)
*H04N 9/31* (2006.01)
(Continued)

(52) U.S. Cl.
CPC .......... *H01S 3/10061* (2013.01); *G02B 27/28* (2013.01); *G02B 27/281* (2013.01); *G02B 27/283* (2013.01); *G02B 27/286* (2013.01); *G02B 27/288* (2013.01); *H04N 9/3158* (2013.01); *H04N 9/3161* (2013.01); *H04N 13/0434* (2013.01); *H04N 13/0459* (2013.01); *H04N 9/3164* (2013.01); *H04N 13/0422* (2013.01)

(58) Field of Classification Search
CPC ..................... H04N 13/0434; H04N 13/0422; H04N 9/3161; H04N 9/3158; H04N 9/3164; G02B 27/286; G02B 27/283; G02B 27/48
See application file for complete search history.

(56) References Cited

U.S. PATENT DOCUMENTS

| 6,283,597 B1 | 9/2001 | Jorke |
| 6,950,454 B2 | 9/2005 | Kruschwitz |
| 6,956,878 B1 | 10/2005 | Trisnadi |

(Continued)

FOREIGN PATENT DOCUMENTS

| EP | 2239602 A1 | 10/2010 |
| WO | 0200538 A2 | 1/2002 |

(Continued)

OTHER PUBLICATIONS

Amm, D.T. et al. 5.2: Grating Light Valve(TM) Technology: Update and Novel Applications. Presented at Society for Information Display Symposium, May 19, 1998 Anaheim, CA, 4 pp. Accessed online Jul. 25, 2012; accessed online Jul. 18, 2013 at www.siliconlight.com/wp-content/thennes/siliconlight/pdf/sid98.pdf.

(Continued)

*Primary Examiner* — Bao-Luan Le
(74) *Attorney, Agent, or Firm* — Hartman Patents PLLC

(57) ABSTRACT

A patterned retarder is described that may be used with a laser source array to obtain a combined beam suitable for laser image projection (e.g., three-dimensional laser image projection using orthogonal polarization states and/or orthogonal color spaces). An effect of the retarder on a polarization state of an incident beam may be dependent on the location of the retarder upon which the beam is incident. In one example, a method of producing a laser beam from a plurality of component laser beams includes directing the plurality of component laser beams onto corresponding regions of such a patterned retarder having a plurality of pattern elements.

20 Claims, 18 Drawing Sheets

(51) Int. Cl.
 *H01S 3/10* (2006.01)
 *H04N 13/04* (2006.01)

(56) References Cited

U.S. PATENT DOCUMENTS

| | | | |
|---|---|---|---|
| 7,023,512 | B2 | 4/2006 | Kurtz |
| 7,370,972 | B2 * | 5/2008 | Morikawa et al. ............ 353/20 |
| 7,436,588 | B2 | 10/2008 | Rothenberg |
| 7,715,084 | B2 | 5/2010 | Tan |
| 7,832,869 | B2 | 11/2010 | Maximus |
| 7,959,297 | B2 | 6/2011 | Silverstein |
| 8,049,825 | B2 | 11/2011 | Lescure |
| 8,081,381 | B2 | 12/2011 | Krasutsky |
| 8,197,068 | B2 | 6/2012 | Bauco |
| 8,602,561 | B2 * | 12/2013 | Klein et al. ....................... 353/8 |
| 8,696,134 | B2 * | 4/2014 | Murakawa et al. ............ 353/20 |
| 8,899,754 | B2 * | 12/2014 | Imai ................................ 353/20 |
| 2007/0153235 | A1 * | 7/2007 | Morikawa et al. ............ 353/20 |
| 2007/0165308 | A1 | 7/2007 | Wang |
| 2009/0051759 | A1 * | 2/2009 | Adkins .............. G02B 27/2264 348/53 |
| 2009/0161196 | A1 | 6/2009 | Malfait |
| 2009/0168186 | A1 | 7/2009 | Williams |
| 2009/0174867 | A1 | 7/2009 | Malfait |
| 2010/0066813 | A1 | 3/2010 | Jorke |
| 2010/0149635 | A1 | 6/2010 | Simon |
| 2010/0165598 | A1 | 7/2010 | Chen |
| 2010/0202725 | A1 * | 8/2010 | Popovich et al. ............ 385/10 |
| 2010/0245773 | A1 * | 9/2010 | Arita .............................. 353/31 |
| 2010/0265420 | A1 | 10/2010 | Lescure |
| 2010/0265467 | A1 | 10/2010 | Lescure |
| 2011/0216390 | A1 | 9/2011 | Tong |
| 2011/0216792 | A1 | 9/2011 | Chann |
| 2011/0242498 | A1 * | 10/2011 | Kosaka et al. ................. 353/33 |
| 2011/0310303 | A1 | 12/2011 | Marcus |
| 2011/0317084 | A1 | 12/2011 | Lee |
| 2011/0317130 | A1 | 12/2011 | Gollier |
| 2012/0013812 | A1 | 1/2012 | Gollier |
| 2012/0019783 | A1 * | 1/2012 | Imai ................................ 353/20 |
| 2012/0044459 | A1 * | 2/2012 | Klein et al. ....................... 353/8 |
| 2012/0062848 | A1 * | 3/2012 | Koyanagi et al. ............ 353/20 |
| 2012/0182487 | A1 | 7/2012 | Konno |
| 2012/0236263 | A1 * | 9/2012 | Murakawa et al. ............ 353/20 |
| 2015/0077713 | A1 * | 3/2015 | Drumm ................ H04N 9/3129 353/8 |

FOREIGN PATENT DOCUMENTS

| | | |
|---|---|---|
| WO | 2008155367 A2 | 12/2008 |
| WO | 2009013597 A2 | 1/2009 |
| WO | 2009108269 A1 | 9/2009 |
| WO | 2011071921 A2 | 6/2011 |
| WO | 2012040797 A1 | 4/2012 |
| WO | 2012139634 A1 | 10/2012 |

OTHER PUBLICATIONS

Bloom, D.M. The Grating Light Valve: revolutionizing display technology. 11 pp. Accessed online Jul. 25, 2012; accessed online Nov. 26, 2013 at http://www.hcinema.de/pdf/glv2.pdf.

Hecht, J. Photonic Frontiers: beam combining—Combining beams can boost total power. LaserFocusWorld, vol. 44, issue 7, 7 pp. Accessed online Jul. 18, 2012 at http://www.laserfocusworld.com/content/lfw/en/articles/print/volume-44/issue-7/features/photonic-frontiers-beam-combining-combining-beams-can-boost-total-power.html.

Janssens, P. MEMS for displays. MEMS in Flanders—IMEC Leuven, Jan. 20, 2011. 11 pp. Accessed online Jul. 30, 2012.

Janssens, P. Speckle Suppression in Laser Projection. 2 pp. Accessed online Jul. 19, 2012 at http://www.osiris-project.eu/uploads/presentations/speckle_suppression-eos_tm-2010.pdf.

LaserFocusWorld. Photonic Frontiers: Beam Combining: Beam combining cranks up the power. LaserFocusWorld, vol. 48, issue 6, 5 pp. Accessed online Jul. 19, 2012 at http://www.laserfocusworld.com/content/lfw/en/articles/print/volume-48/issue-06/features/beam-combining-cranks-up-the-power.html.

Mansuripur, M. et al. The Optics of Semiconductor Diode Lasers. Optics & Photonics News, Jul. 2002, pp. 57-61. Accessed online Jul. 20, 2012. Accessed online Jul. 18, 2013 at fp.optics.arizona.edu/Masud/laser_diode.pdf.

Meadowlark Optics. Principles of Retarders, pp. 20-31. Accessed online Jul. 30, 2012. Accessed online Jul. 18, 2013 at http://www.coe.montana.edu/ee/jshaw/classes/EOSystems/F09/LabResources/MeadowlarkOpticsRetarders.pdf.

Melles Griot. Gaussian Beam Optics, 18 pp. Accessed online Mar. 10, 2012. Accessed online Jul. 18, 2013 at mccombe.physics.buffalo.edu/lab-manuals/MG-GaussianBeams.pdf.

Newport Corp. Polarization, 5 pp. Accessed online Jul. 18, 2012 at http://www.newport.com/Polarization/144921/1033/content.aspx.

Olympus Microscopy Resource Center. Optical Birefringence. 5 pp. Accessed online Jul. 10, 2012 at http://www.olympusmicro.com/primer/lightandcolor/birefringence.html.

OSRAM Opto Semiconductors. Application Note: Projection with LED Light Sources. Feb. 2012, 11 pp. Accessed online Jul. 18, 2012; accessed online Jul. 18, 2013 at http://catalog.osram-os.com/catalogue/catalogue.do?act=downloadFile&favOid=020000020003fea8000200b6.

Shankland, S. Dolby stakes its claim in 3D movie tech. 5 pp. Accessed online Jul. 25, 2012 at http://www.cnet.com.au/dolby-stakes-its-claim-in-3d-movie-tech-339282656.htm.

Silverstein, B. et al. Projection Displays: Lasers inject new life into projection displays. LaserFocusWorld, vol. 48, issue 3, 5 pp. Accessed online Jul. 22, 2012 at http://www.laserfocusworld.com/content/lfw/en/articles/print/volume-48/issue-03/features/lasers-inject-new-life-into-projection-displays.html.

Stereoscopy.com. Interference Filters (Wavelength multiplex visualisation) / Infitec(TM). 2 pp. Accessed online Jul. 25, 2012 at http://www.stereoscopy.com/faq/interference-filters.html.

Thomas, F. Multilevel Subwavelength Optical Data Storage Using Reflective Nanostructures (NG-DVD & AO-DVD). 2005 INSIC Symposium—Alternative Data Storage, 11 pp. Accessed online Jul. 24, 2012; accessed online Jul. 19, 2013 at http://www.fredcthomas.info/Subwavelength_Optical_Data_Storage_V2_-Fred_Thomas_2005_INSIC.pdf.

Wang, J. et al. Nano-optics boost projection-display performance. LaserFocusWorld, vol. 42, issue 11, 5 pp. Accessed online Jul. 24, 2012 at http://www.laserfocusworld.com/content/lfw/en/articles/print/volume-42/issue-11/imaging-amp-displays-supplement/nano-optics-boost-projection-display-performance.html.

Williams, F.L. et al. Projection Displays: Lasers and MEMS take video projection beyond HDTV. LaserFocusWorld, vol. 44, issue 10, 5 pp. Accessed online Jul. 18, 2012 at http://www.laserfocusworld.com/content/lfw/en/articles/print/volume-44/issue-10/features/projection-displays-lasers-and-mems-take-video-projection-beyond-hdtv.html.

Bai, B. Artificial optical activity in chiral resonant nanogratings. Proc. of SPIE vol. 7393, Nanophotonic Materials VI, pp. 73930K-1 to 73930K-11, Sep. 1, 2009.

Dong, H. et al. High-performance illumination system design with new light source of LD array for laser projection display. Proc. SPIE 8335, 2012 International Workshop on Image Processing and Optical Engineering, pp. 83350E-1 to 83350E-7, Nov. 15, 2011.

Jansen, M. et al. Visible Laser Sources for Projection Displays. Proc. SPIE 6489, Projection Displays XII, pp. 648908-1 to 648908-6, Feb. 6, 2007.

Wang, J.J. et al. High-performance optical retarders based on all-dielectric immersion nanogratings. Optics Letters, vol. 30, No. 14, Jul. 15, 2005, pp. 1864-1866.

International Search Report and Written Opinion of the International Searching Authority in International application No. PCT/EP2013/065996, Nov. 22, 2013 (12 pp.).

Ajito, T. et al. Expanded color gamut reproduced by six-primary projection display. 8 pp. Accessed online Jul. 24, 2012; accessed online Nov. 26, 2013 at http://fp.optics.arizona.edu/opti588/Presentation/EnrichedColorDisplay/Ajito_Expandedcolorgamut_6_primarycolor_SPIE00.pdf.

(56) References Cited

OTHER PUBLICATIONS

Aksit, K. et al. Light Engine and Optics for HELIUM3D Auto-Stereoscopic Laser Scanning Display. 4 pp. Accessed online Jul. 22, 2012; accessed online Nov. 26, 2013 at http://discovery.ucl.ac.uk/1317557/1/Helium3D%20paper%20260111.pdf.

Apte, R.B. Grating Light Valves for High Resolution Displays. Ph.D. thesis, Stanford Univ, Jun. 1994. 104 pp. Accessed online Jul. 25, 2012; accessed online Nov. 26, 2013 at www2.parc.com/emdl/members/apte/glv.pdf.

Cantrell, C.D. Polarization, 34 pp. Univ. of Texas at Dallas. Accessed online Mar. 15, 2013; accessed online Jul. 18, 2013 at www.utdallas.edu/~cantrell/ee6334/polarization.pdf.

Chinnock, C. Kodak's Laser Cinema Projector Ready to Go. Large Display Report, vol. 9, No. 1, Jan. 2011, 6 pp. Accessed online Jul. 19, 2012; accessed online Jul. 19, 2013 at http://motion.kodak.com/motion/uploadedFiles/Kodak/motion/Products/Laser_Projection_Technology/us_en_Laser_Projection_01-2011_LDR_Kodak.pdf.

CVI Laser Optics and Coatings. Polarization Tutorial. 5 pp. Accessed online Jul. 21, 2012; accessed online Jul. 18, 2013 at https://www.cvimellesgriot.com/Products/Documents/GeneralInfo/PolarizationTutorial.pdf.

Dodds, S. Physics 231 Polarization. 10 pp. Accessed online Jul. 24, 2012; accessed online Nov. 26, 2013 at www.owlnet.rice.edu/~dodds/Files231/polariz.pdf.

Fan, T.Y. Laser Beam Combining for High-Power, High-Radiance Sources. Accessed online Jul. 18, 2012; accessed online Jul. 19, 2013 at http://www.II.mit.edu/news/Fan_LaserBeamCombining.pdf.

Janssens, P. et al. Future prospects of high-end laser projectors. 12 pp. Accessed online Jul. 10, 2012 at http://www.osiris-project.eu/uploads/presentations/7232-34_photonics.pdf.

Janssens, P. 9.5: Laser projector speckle measurements. 3 pp. Accessed online Jul. 19, 2012 at http://www.osiris-project.eu/uploads/presentations/laser_projector_speckle_measurements_sideurodisplay09.pdf.

Janssens, P. et al. 9.3: LCoS Laser Projector. 4 pp. Accessed Jul. 18, 2012 at http://www.osiris-project.eu/uploads/presentations/lcos_laser_projector_sideurodisplay09.pdf.

Luna Technologies. Introduction to Polarization. 4 pp. Accessed online Jul. 18, 2012. Accessed online Jul. 18, 2013 at lunainc.com/wp-content/uploads/2012/08/21intropolarizationweb.pdf.

Mitani, K. et al. Optical Engine for Liquid Crystal Projection Using Continuous Grain Silicon TFT. 5 pp. Accessed online Jul. 26, 2012. Accessed online Jul. 18, 2013 at www.sharp-world.com/corporate/info/rd/t2/pdf/11.pdf.

Moskalev, I.S. et al. External cavity multiwavelength superbroadband diode laser. Optics Communications 220 (2003) 161-169. Accessed online Jul. 24, 2012. Accessed online Jul. 18, 2013 at people.cas.uab.edu/~mirov/Mirov_files/Optics%20Comm2003.pdf.

New Focus, Inc. Application Note 3: Polarization and Polarization Control, 1993. 8 pp. Accessed online Jul. 21, 2012; accessed online Jul. 18, 2013 at aries.ucsd.edu/LMI/TUTORIALS/polarization.pdf.

Optec. Five Channel Prism—P/N C0045. Oct. 10, 2000, 2 pp. Accessed online Jul. 25, 2012; accessed online Jul. 18, 2013 at http://www.optec.eu/eng/multichannel/FIVE%20CHANNEL%20PRISM%20C0045.pdf.

Optec. Three Channel Prism—P/N 0297. Apr. 30, 1999, 2 pp. Accessed online Jul. 25, 2012; accessed online Jul. 19, 2013 at http://www.optec.eu/ita/multichannel/THREE%20CHANNEL%20PRISM%20RGB0297.pdf.

Optec. Three Channel Prism—P/N 9901. Oct. 10, 2000, 2 pp. Accessed online Jul. 25, 2012; accessed online Jul. 19, 2013 at http://www.optec.eu/ita/multichannel/THREE%20CHANNEL%20PRISM%20RGB9901.pdf.

Optics Balzers AG. Dichroic Color Mirrors. OBA 008PE (0901-1), 2 pp. Accessed online Jul. 25, 2012; accessed online Jul. 18, 2013 at http://www.opticsbalzers.com/data/tmp/1374186251_OBA%20008%20PE.pdf.

Optics Balzers AG. LED ColorDichroics(TM). OBA 035PE (0901-1), 2 pp. Accessed online Jul. 25, 2012. Accessed online Jul. 18, 2013 at http://www.opticsbalzers.com/data/tmp/1374186281_OBA%20035%20PE.pdf.

Roth, S. et al. 64.4: Four Primary Color Projection Display. 4 pp. Accessed online Jul. 24, 2012. Accessed online Jul. 18, 2013 at www.genoacolor.com/media/dbimages/64-4.pdf.

Shevlin, F.P. Speckle reduction in laser-illuminated picoprojectors. 8 pp. Accessed online Jul. 18, 2013 at http://www.dyoptyka.com/publications/Dyoptyka-PW-8252-4-updated.pdf.

Trisnadi, J.I. Speckle contrast reduction in laser projection displays. 7 pp. Accessed online Jul. 9, 2012; accessed online Jul. 18, 2013 at www.siliconlight.com/wp-content/themes/siliconlight/pdf/speckle-spie.pdf.

Williamson, R. Polarization Optics Tutorial: Polarizers, Waveplates, Rotators, and Lyot Filters, 2005. 8 pp. Accessed online Jul. 24, 2012; accessed online Jul. 18, 2013 at www.ray-optics.com/Polarization_Tutorial.pdf.

Xu, M. et al. Speckle Characterization in Laser Projector Display. World Academy of Science, Engineering and Technology 63 2012, pp. 459-462. Accessed online Jul. 19, 2012; accessed online Jul. 18, 2013 at www.waset.org/journals/waset/v63/v63-89.pdf.

Zhai, Y. Laser Engines and Laser Speckle. Micron Technology, Inc. Technical Marketing Brief. Aug. 2011. 5 pp. Accessed online Jul. 19, 2012.

Zhu, H. et al. Etendue and Optical Throughput Calculations. Energetiq Technology, Inc., Woburn, MA, 2011, 5 pp. Accessed online Jul. 18, 2012; accessed online Jul. 18, 2013 at http://www.energetiq.com/DataSheets/Energetiq_AppNote_Etendue%20Calculator_02-14/2011.pdf.

* cited by examiner

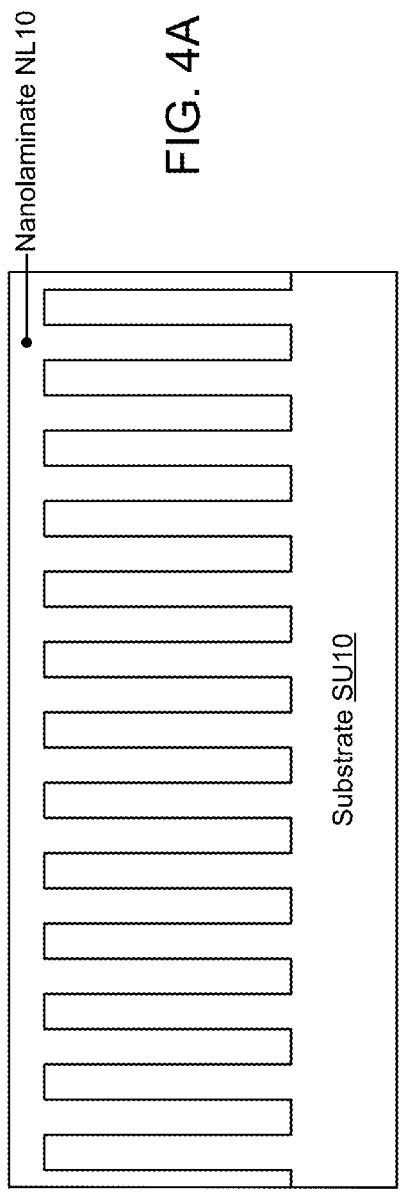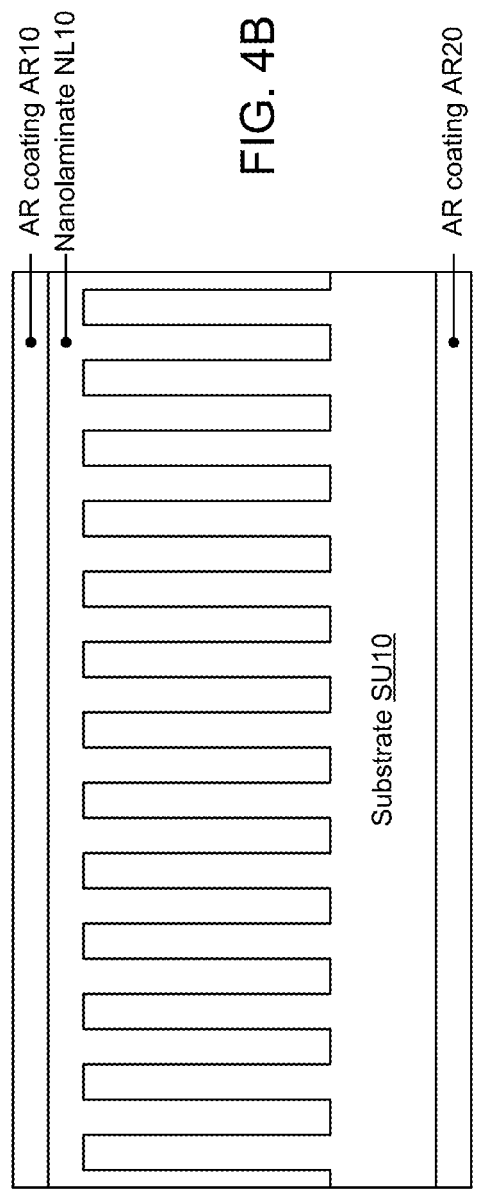

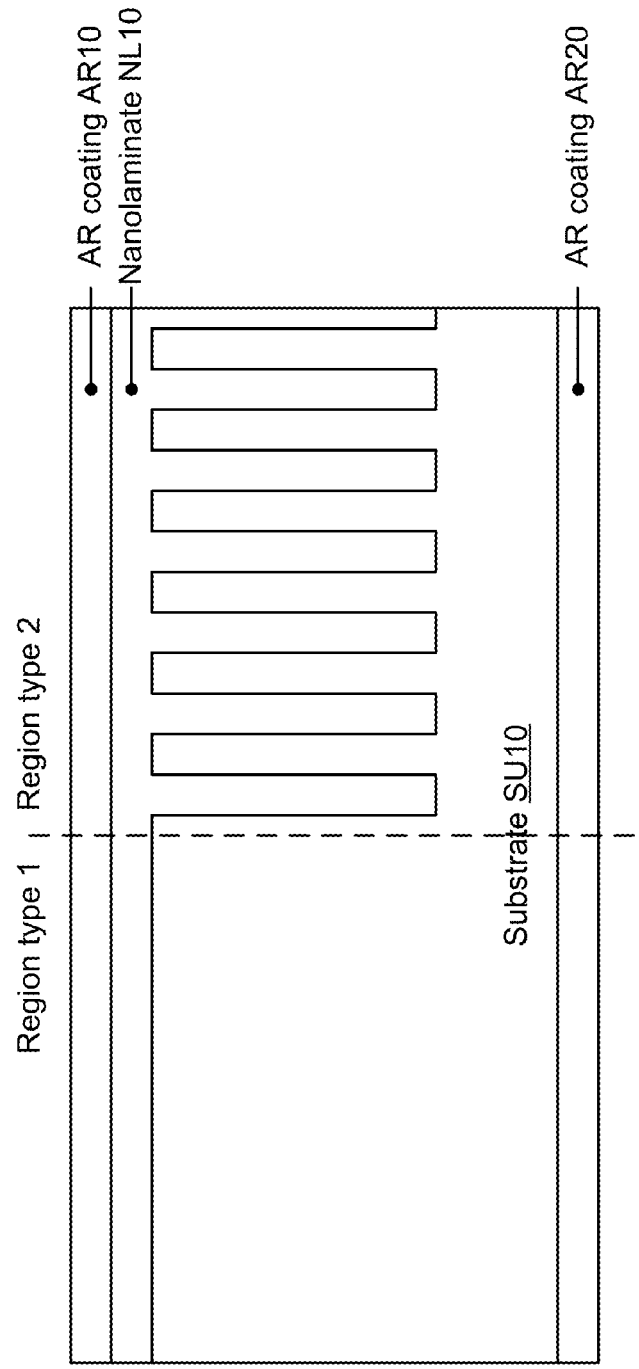

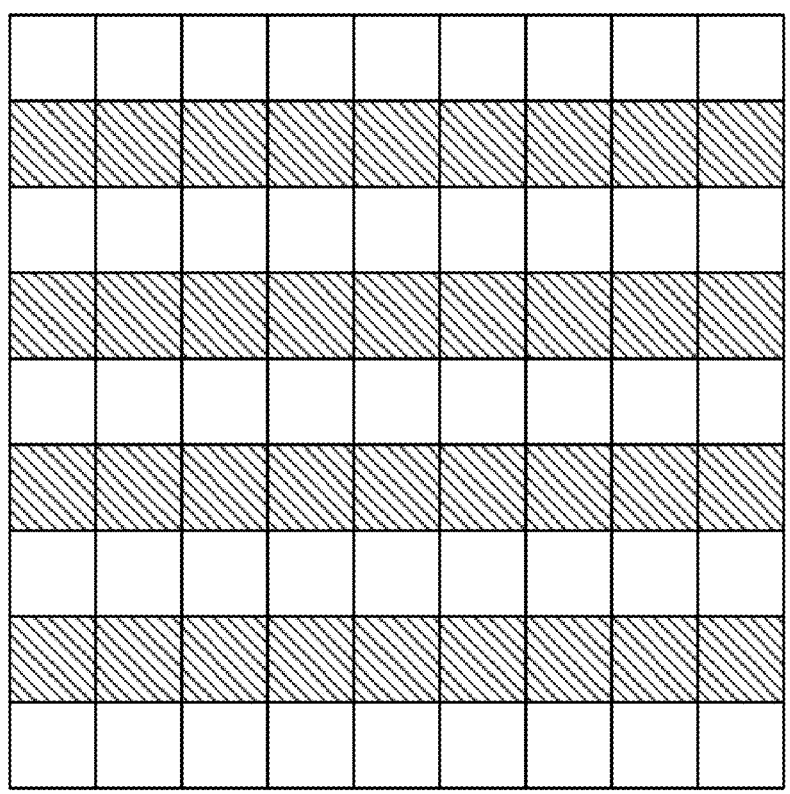

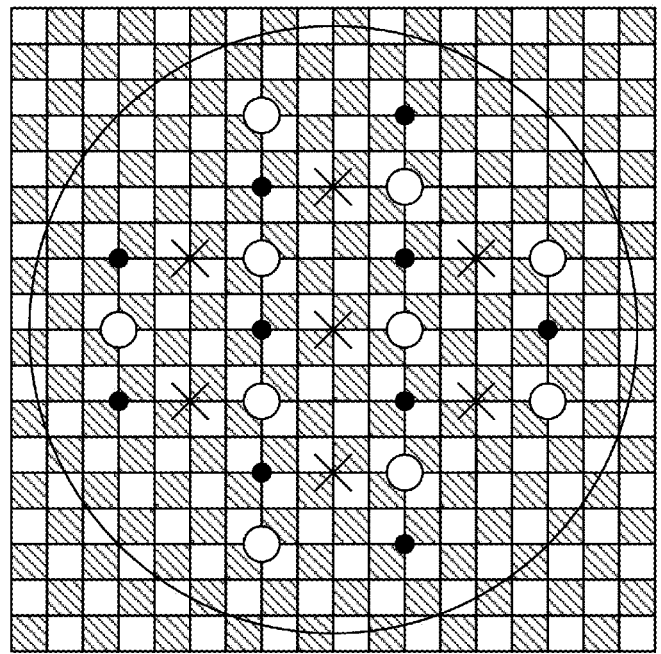
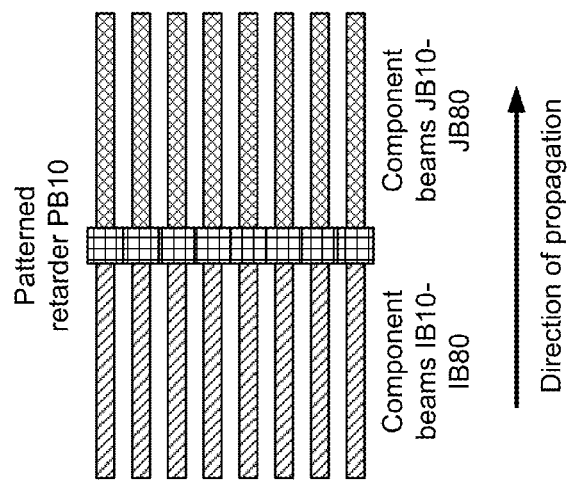
FIG. 15A
FIG. 15B

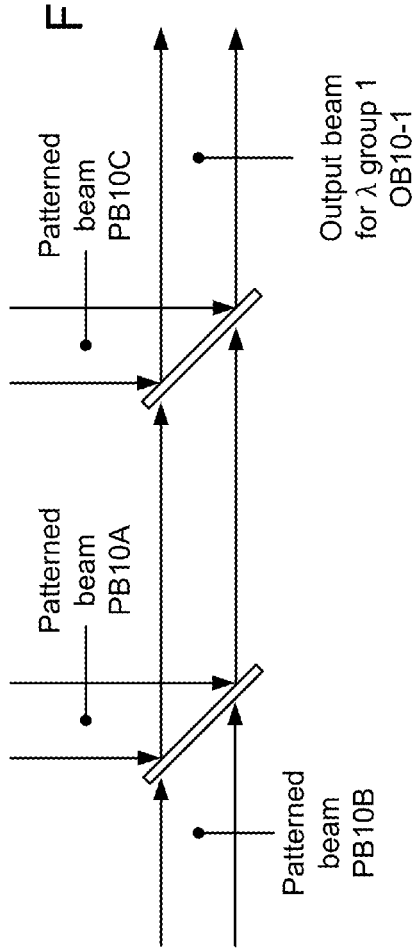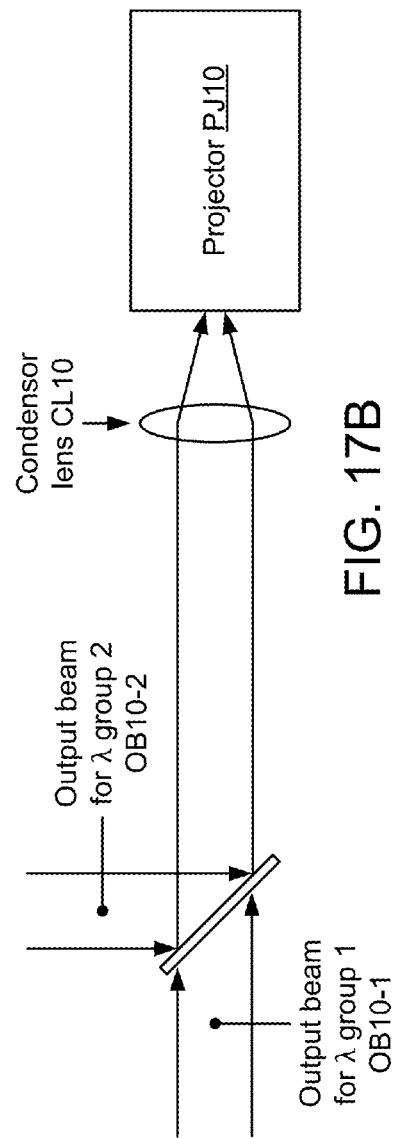

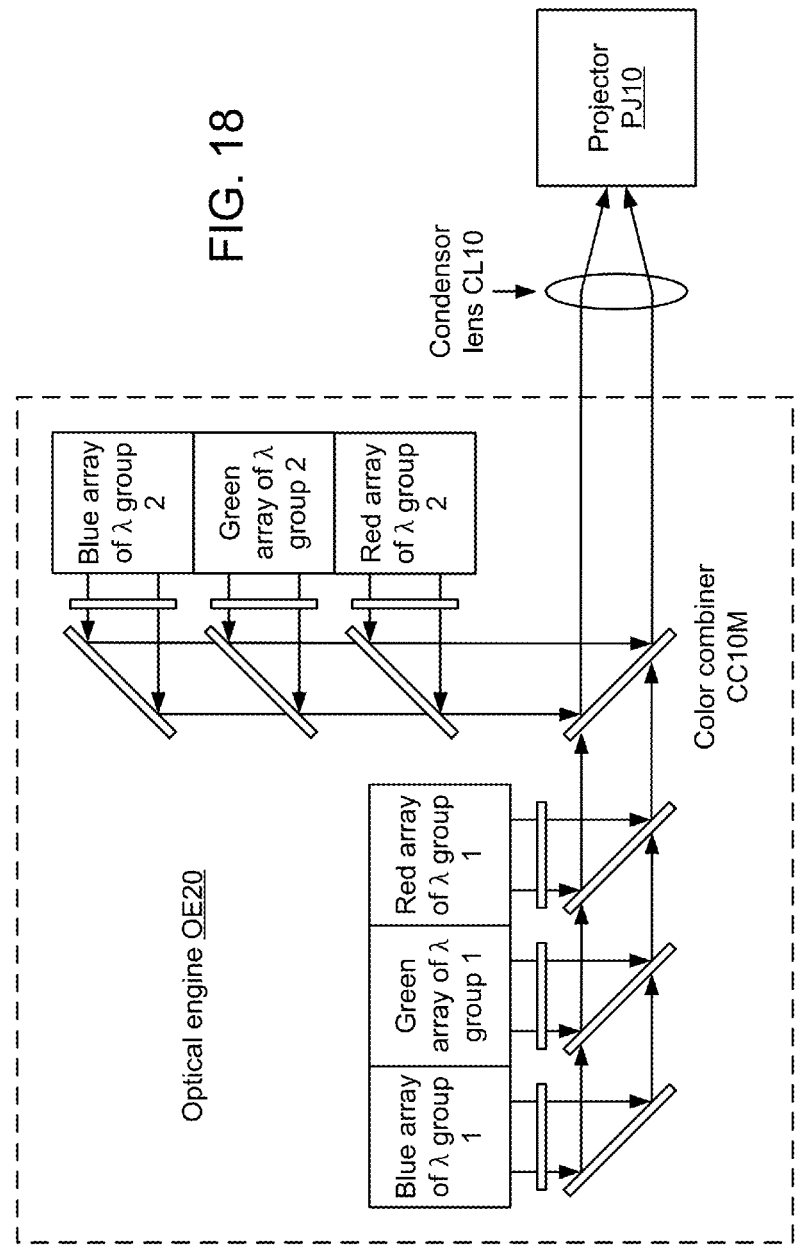

PATTERNED RETARDER AND OPTICAL ENGINE FOR LASER PROJECTION APPARATUS

RELATED APPLICATIONS

This application claims benefit of U.S. Provisional Pat. Appl. No. 61/678,012, entitled "PATTERNED RETARDER AND OPTICAL ENGINE FOR THREE-DIMENSIONAL LASER PROJECTION APPARATUS," filed Jul. 31, 2012.

FIELD

This disclosure relates to lasers.

BACKGROUND

In recent years, a trend to replace traditional short arc lamps in projectors with solid-state light sources has been seen. This trend has been mainly driven by the limited lifetime of these lamps, which impacts the system's cost of ownership and reliability. While light-emitting diodes (LEDs) are well-suited for low-light-output products, the brightness levels of typical LEDs are inadequate for high-brightness projectors (e.g., for digital cinema and/or large-venue projection applications). For that high-end market segment, lasers come into play. Apart from a longer lifetime, lasers offer other benefits. Their narrow spectrum results in a very large color gamut and due to the very low intrinsic étendue of the laser source, projection engines could become less complex, more efficient, smaller and more powerful.

SUMMARY

An apparatus for producing a laser beam according to a general configuration includes a plurality N of laser beams and a patterned retarder comprising a plurality N of pattern elements. Each of the plurality N of laser beams has a certain polarization state and is directed to radiate onto an entrance side of a corresponding one of the pattern elements and to exit from an exit side of the pattern element. In this apparatus, the plurality N of pattern elements includes a plurality of first pattern elements and a plurality of second pattern elements. For each of the plurality of first pattern elements, the variation of the arc angle between the Poincaré representation points of (A) the polarization state of the corresponding laser beam at the entrance side and (B) the polarization state of the laser beam at the exit side is within ten percent of a value P1. For each of the plurality of second pattern elements, the variation of the arc angle between the Poincaré representation points of (A) the polarization state of the corresponding laser beam at the entrance side and (B) the polarization state of the laser beam at the exit side is within ten percent of a value P2, which differs from the value of P1 by pi radians.

An apparatus for producing a laser beam according to another general configuration includes a first plurality of patterned retarders, each retarder corresponding to a different one of a plurality of primary colors, and a first plurality of laser source arrays, each array corresponding to a different one of the first plurality of patterned retarders and arranged to radiate a plurality of laser beams that are directed onto the corresponding retarder. This apparatus also includes first color combining optics arranged to receive a combined beam from each of the first plurality of patterned retarders and to combine the received beams to produce a first multi-primary beam. In this apparatus, for each of the first plurality of patterned retarders, an effect of the retarder on a polarization state of an incident beam is dependent on the location of the retarder upon which the beam is incident.

A method of producing a laser beam from a plurality N of component laser beams according to a general configuration includes directing the plurality N of component laser beams onto corresponding regions of a patterned retarder that has a plurality N of pattern elements, wherein an effect of the retarder on a polarization state of an incident beam is dependent on the location of the retarder upon which the beam is incident.

BRIEF DESCRIPTION OF THE DRAWINGS

FIGS. 4A and 4B show portions of cross-sections of two examples of a structure for a patterned retarder.

FIG. 5 shows a portion of a cross-section of an example of the retarder at a boundary between pattern elements.

FIG. 6 shows an example of a patterned retarder having a striped pattern.

FIG. 15A shows an example of the retarder of FIG. 14 as applied to the combined beam of FIG. 3.

FIG. 15B shows an example of a use of the arrangement of FIG. 15A.

FIG. 17A shows an example of another optical combining path for engine OE10.

FIG. 17B shows an example of combining patterned beams from two multi-primary paths.

FIG. 18 shows a diagram of an implementation OE20 of optical engine OE10.

DETAILED DESCRIPTION

Figure 1:
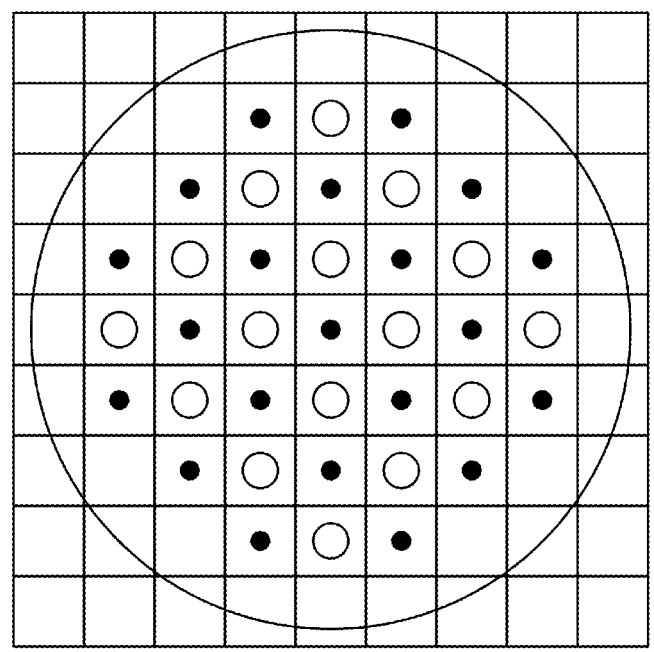
FIG. 1 shows a cross-section of a combined laser beam.

Implementation of laser projection systems may involve challenges such as cost, cooling, and safety. Regarding laser image quality, speckle is typically a critical concern. Speckle arises when coherent light that has been scattered from a rough surface (e.g., a projection screen) is detected by a square-law intensity detector that has a finite aperture (e.g., an observer's eye). Due to fluctuations in the height profile of the projection surface (e.g., surface imperfections), the incident laser beam scatters randomly such that rays arriving at the observer's eye have random phases. These reflected rays interfere with one another constructively and destructively to create speckle, which typically appears as a granular pattern on the screen that is superposed on the projected image. In projection applications, speckle generally causes the projected image to appear to be quantized into small areas whose sizes are equal to the resolution spot of the detector (e.g., the observer's eye).

Speckle reduction is typically based on averaging N speckle configurations that are independent (i.e., that are both uncorrelated and non-interfering). In general, there are four different approaches to speckle reduction. The first approach is screen-based speckle reduction (e.g., screen motion). The other three approaches (angular diversity, wavelength diversity, and polarization diversity) are typically performed at the projector.

Angular diversity refers to the use of a light source having a reduced coherence, such that light arrives at the screen from different angles. Such an effect may be achieved by reducing the coherence of the laser (e.g., using a rotating or otherwise moving diffuser, refractive element, lenslet array, or refractive prism in the optical path) and/or by using mutually incoherent sources of the same wavelength.

To achieve angular diversity, the angular separation of the sources should be larger than the numerical aperture of the eye of the observer, which depends on the distance between the observer and the screen. This effect has some important implications on the design of a laser projector, as the degree of speckle reduction is limited by the diameter of the aperture of the projection lens. The speckle reduction factor is expected to be proportional to the diameter of the aperture of the camera or, in other words, inversely proportional to the f-number of the camera lens.

A beam deflector may be used to achieve speckle reduction by angular diversity. An optical phase shifting device may also be used to achieve speckle reduction by angular diversity. For practical high-end projection systems, however, such an approach alone is typically not enough to deliver the desired level of speckle reduction. The size and acceptance angle limits of commercial light valves also restrict the amount of angular diversity that can be introduced. A light valve (also called a light modulator) can use a transmissive technology, such as liquid crystal panels, in which individual elements are switched to on states, off states, or states somewhere between on and off, depending on the amount of light that is required to be transmitted at that pixel location. Alternatively, the light modulator can use a reflective technology, such as Digital Light Processing (DLP, which may be implemented with a digital mirror device or DMD) or Liquid Crystal On Silicon (LCOS).

In one example, angular diversity is maximized by using a diffusing element and an integrating element in the optical path of the beam. Examples of a diffusing element include a diffuser, a diffractive element, lenslet array, refractive prism array, and a holographic element. Examples of an integrating element include a rod, a pipe, and a fly-eye integrator. Once light enters an integrating element such as a rod or pipe, it remains within the bounds of the element due to internal reflection off the longitudinal walls of the rod or pipe. The integrating element may be adapted to fill the éntendue of the projector as uniformly as possible, without scattering light over larger angles that are not accepted by the projector's optical system and projection lens (which would typically lead to reduced light efficiency).

Wavelength diversity applies the principle that the speckle patterns from two beams with different wavelengths become uncorrelated if the average relative phase-shift is large enough (i.e., about two pi or more). If the average surface profile height variation is y, then the required wavelength difference $\delta\lambda$ is $\lambda^2 2y$. Wavelength diversity may be implemented by using multiple lasers, each with a wavelength that differs by at least $\delta\lambda$ from the others. For a typical projection screen, a spacing between adjacent wavelengths of from 0.5 to 2 nm may be desirable, but the spacing can also be larger than 2 nm, and for some silver screens a spacing of up to 5 nm may be desirable.

Wavelength diversity is easily achieved for direct laser diodes, as the spectrum of such a source is about 1 nm wide. These lasers are currently available in high power and efficiency for blue (<488 nm) and red (>630 nm) primary colors. For the green primary (around 520-535 nm), however, such wide sources are not currently available at sufficiently high power. Consequently, high-power green lasers are generally obtained using frequency doubling of IR lasers, which produces a beam having a very narrow spectrum (e.g., on the order of 0.1 nm).

With current semiconductor technology, it is not easy to obtain a spread of greater than 6 nm for a green primary. A spacing that is too wide may also result in less saturated colors and/or a perceptible color difference. One example of a range of wavelengths for a three-primary system is A) five wavelengths in the range of from 635 nm to 637 nm for the red primary (where the wavelength shift is obtained, for example, by modifying the temperature of the junction); B) the six wavelengths 529.75 nm, 530.70 nm, 531.75 nm, 532.50 nm, 533.75 nm, and 534.60 nm for the green primary; and C) the four wavelengths 464.20 nm, 456.25 nm, 466.20 nm, 467.20 nm for the blue primary.

A polarization-diversity approach to speckle reduction applies the principle that perpendicular (or "orthogonal") polarization states do not interfere with each other. Also, the reflection off the projection screen is typically different for the different polarization states incident on the screen. A speckle reduction by $\sqrt{2}$ may be expected for a case in which a depolarizing screen (e.g., a white diffusing surface) is used in combination with a polarized projector. The scattering on many screen materials will result in a depolarization of the incoming field, which means that the reflection at a diffuse surface of a polarized laser yields two independent speckle patterns and thus a speckle reduction by a factor of $\sqrt{2}$ is possible. In case an unpolarized laser source is used, an additional factor of $\sqrt{2}$ can be gained, resulting in speckle suppression by a factor of two.

While polarization diversity can result in speckle suppression by a factor of 2 (at maximum), it has the disadvantage that it is not compatible with stereoscopic 3D solutions based on polarization. For example, it may be desirable to use a polarized beam and a polarization-preserving screen with such a 3D system, rather than an unpolarized beam and a depolarizing screen.

In order to maximize the speckle suppression with sufficient image quality, it may be desirable to combine two or more (possibly all) of these four techniques. Screen-based solutions may not be acceptable for some applications involving projectors. Therefore, it may be desirable to focus on the three other principles: e.g., by maximally exploiting angular diversity (within the étendue limits of the optical system) for each of the wavelengths and for both polarization states. In order for all three techniques to have cumulative effects, it may also be desirable for the amount of light for each wavelength and each polarization to be uniform across the surface of the light modulator and for the angular distribution at each point on the surface of the light modulator to be as uniform as possible.

It may be desirable to obtain a laser projector that is capable of projecting images, such as 2D images or 3D stereo images. It may be desirable to implement an optical engine that provides a beam suitable to drive such a projector. One mode of 3D stereo image projection is based on polarization ("polar 3D"). Another mode of 3D stereo image projection is based on multiple (i.e., two or more) bands per primary color ("color 3D"). It may be desirable to obtain a projector that is capable of producing stereo images using either and/or both of polar 3D and color 3D.

In the case of polar 3D, it may be desirable for the optical engine to maintain polarization of the beam (e.g., by using one or more retarders in the optical path). When the color-3D stereo mode is used, however, using a polarized beam is typically not beneficial for speckle reduction. For color 3D, it may be desirable for the optical engine to provide the projector with at least two sets of wavelengths for each primary color, but such diversity may make it difficult to provide a beam having sufficiently high polarization when the polar-3D stereo mode is used and the polarization of the beam is switched from one state to another.

Figure 2:
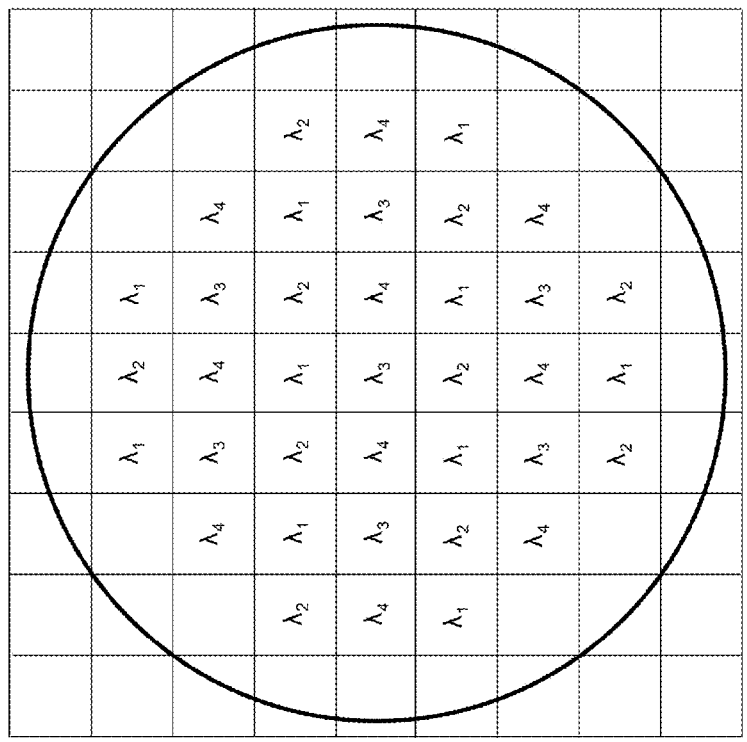
FIG. 2 shows a cross-section of another example of a combined laser beam.
Figure 3:
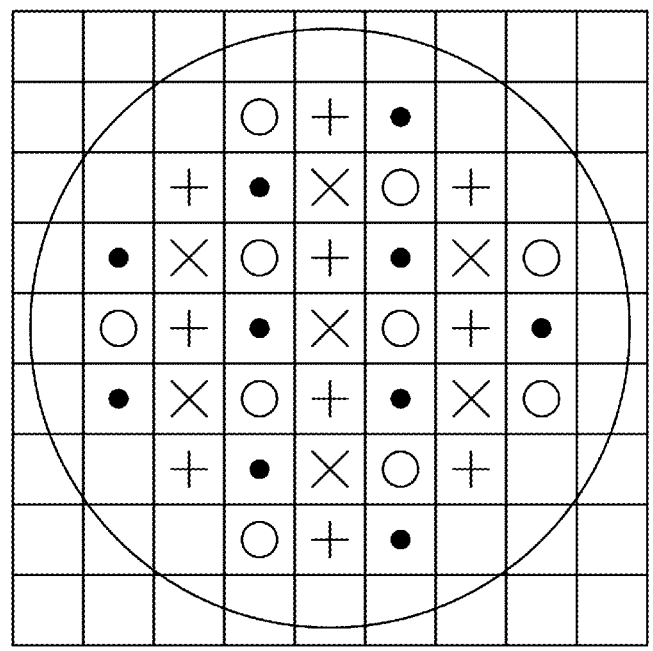
FIG. 3 shows another version of FIG. 2.

For high-brightness projectors, it may be desirable to obtain a beam for at least one of the primary colors by combining the beams from multiple individual laser sources. A preferred way to combine these beams is to arrange the individual laser sources in an array and create a collimated combined laser beam. FIG. 1 shows a cross-section of an example of such a combined beam that includes thirty-seven component beams having two different wavelengths $\lambda_1$, $\lambda_2$ that are arranged in a two-dimensional pattern, in which each component beam is labeled by its corresponding wavelength (indicated by dots and circles, respectively). FIG. 2 shows a view of a cross-section of another example of such a combined beam that includes thirty-seven component beams having four different wavelengths $\lambda_1$-$\lambda_4$ that are arranged in a two-dimensional pattern, in which each component beam is labeled by its corresponding wavelength. FIG. 3 shows another version of FIG. 2 in which dots, circles, crosses, and X's are used to label each component beam according to its wavelength.

The individual sources may be solid-state sources (e.g., semiconductor structures, such as laser diodes). In one such example, the array is created by integrating laser diodes oscillating at different wavelengths on a single substrate (e.g., on a single chip). In another example, the array is assembled from multiple laser diodes that may be manufactured separately. The relative arrangement among the sources may differ for arrays of different primaries, and each array will likely include collimating optics to form the collimated combined beam and possibly additional directing optics (e.g., mirrors and/or prisms) to direct the component beams and/or the combined beam.

It may be desirable for the separation between the different wavelengths to be at least the spectral width of one laser and at least 0.5 nm in case of a very narrow spectral width per laser. In one example, the multiple wavelengths of the laser light sources for at least one (possibly all) of the primary colors are separated by at least 0.5 nm and less than 2 nm.

It may be desirable to form the combined beam such that the wavelengths are distributed substantially uniformly across its area. In the arrangement of FIG. 1, for example, no component beam is adjacent (in an eight-connected sense) to any other component beam having the same wavelength, and each component beam is adjacent (in an eight-connected sense) to at least one component beam of each other wavelength.

For most laser sources, the properties of the emitted beam are not circular-symmetric. In other words, the diameter or the divergence (or both) of the laser beam is typically different in two orthogonal directions that are perpendicular to the direction of propagation of the emitted beam. For a diode source, for example, the beam width along the long axis of the cross-section may be between two and five times the beam width along the short axis of the cross-section. Consequently, in order to create a combined laser beam in which the individual beams are packed very close together, it may be desirable to arrange the array such that all of the corresponding individual sources have the same orientation. For example, it may be desirable to arrange the sources such that, for each of the component beams within the combined beam, the long axis of the cross-section of the beam points in the same direction.

Due to the mechanical dimensions of the laser sources (e.g., a large relative difference between the height and width of the emitting face of a source), it may be difficult to build an array such that the polarization of the beams as emitted by some (e.g., half) of the sources is rotated with respect to the polarization of the beams as emitted by others (e.g., the other half) of the sources. Consequently, it may be desirable to construct the array such that the polarizations of the individual beams are aligned and the combined laser beam is polarized.

To implement a color-3D projection system, it may be desirable to provide at least two ranges of wavelengths for each of the primary colors. In a typical example, three primary colors are used (e.g., red, green, and blue). The wavelengths for these colors are typically within the ranges of 600-620 nm (red), 500-570 nm (green), and 425-500 nm (blue), respectively. Systems having more than three primary colors are also possible. In one such example, a fourth primary color is used which has a wavelength in the range of 550-600 nm (yellow). A system having two separate ranges of wavelengths for each of three primary colors may also be referred to as a six-primary system. Typically, all of the ranges of wavelengths are separate from one another (i.e., non-overlapping). The numbers of different wavelengths in a range may be the same for each primary and/or range, or may be different for different primaries and/or ranges. To maximize the despeckle effect, it may be desirable for the optical powers of the different wavelengths in a range of wavelengths to be substantially equal (e.g., within two, five, ten, fifteen, twenty, twenty-five, or thirty percent).

In one example, beams from a first range of wavelengths for a red primary, a first range of wavelengths for a green primary, and a first range of wavelengths for a blue primary are combined to obtain a first combined laser beam, and beams from a second range of wavelengths for the red primary, a second range of wavelengths for the green primary, and a second range of wavelengths for the blue primary are combined to obtain a second combined laser beam (e.g., as shown in FIG. 18). Such an example may be extended to include more ranges (and a corresponding combined beam for each additional range) and/or to include more primaries within one or more of the combined beams.

It is typically desirable to configure an optical engine to combine the primary colors in a manner that minimizes the etendue of the engine. One such method is to use a dichroic color combiner or similar beam combiner to overlay two or more sets of primaries in étendue space. In order to view the projected image, the viewer may wear goggles (e.g., passive goggles) having dichroic color splitters that are similar to the dichroic color combiner. Such goggles may be configured, for one eye, to pass the wavelengths of the first set of primaries and block the wavelengths of the second set of primaries, and for the other eye, to pass the wavelengths of the second set of primaries and block the wavelengths of the first set of primaries.

In order to reduce speckle, it may be desirable that the first and second combined beams as described above (i.e., each beam is a combination of one of the ranges of wavelengths from each primary color) are globally unpolarized laser beams. Within each range of wavelengths, it may be desirable that for each of the individual wavelengths in the range, both polarization states are equally represented. Unfortunately, such desires may conflict with the desire to pack the sources in an array as described above, which produces a polarized combined beam.

One approach to reconciling these competing desires is to use a patterned retarder to selectively alter one or more properties of beams emitted by the individual laser sources. The patterned retarder may be fashioned from a dichroic material, although any other suitable material may also be used. As described below, such a retarder may be used for laser projection of images (e.g., two- or three-dimensional laser projection).

The principle of one example of such a dichroic retarder is explained in Wang et al., "High-performance optical retarders based on all-dielectric immersion nanogratings," Optics Letters, Vol. 30, No. 14 (2005), pp. 1864-1866. For example, the retarder may be produced by forming a high-aspect-ratio nanograting in a crown glass wafer (e.g., a 0.5-mm-thick BK7 wafer) and filling the trenches of the nanograting with a nanolaminate material (e.g., by repeated deposition of monolayers of dielectric material, such as titanium dioxide and silicon dioxide). FIGS. 4A and 4B show portions of cross-sections of two examples of such a structure, where the structure of FIG. 4B includes an anti-reflective coating on each of the entrance and exit surfaces of the structure. In one example, the nanograting has a period of 200 nm, a line width of 100 nm, and a height of at least 700 nm, although other dimensions and higher aspect ratios (e.g., up to 12:1 or more) are also possible. The desired extent of retardance (e.g., in degrees) may be controlled by changing the number M of monolayers of $TiO_2$ between each monolayer of $SiO_2$. (e.g., where M may range from five to seven to nine to twenty or more). The number of layers in the nanolaminate is typically more than 500×(M+1), and the intervening differing layers may also be omitted such that the nanolaminate comprises, for example, 500 or more consecutive layers of the same dielectric (e.g., $TiO_2$). The period, height, line width, layer composition, and/or value of M may be adjusted according to the wavelength of the beam that is to pass through a particular section (e.g., to obtain the same degree of retardance for different wavelengths). Other examples of dielectric material that may be used in layers of such a nanolaminate include Si, $SiN_x$, $Al_2O_3$, $ZrO_2$, $Ta_2O_5$, $HfO_2$, $Nb_2O_5$, and $MgF_2$.

Figure 8:
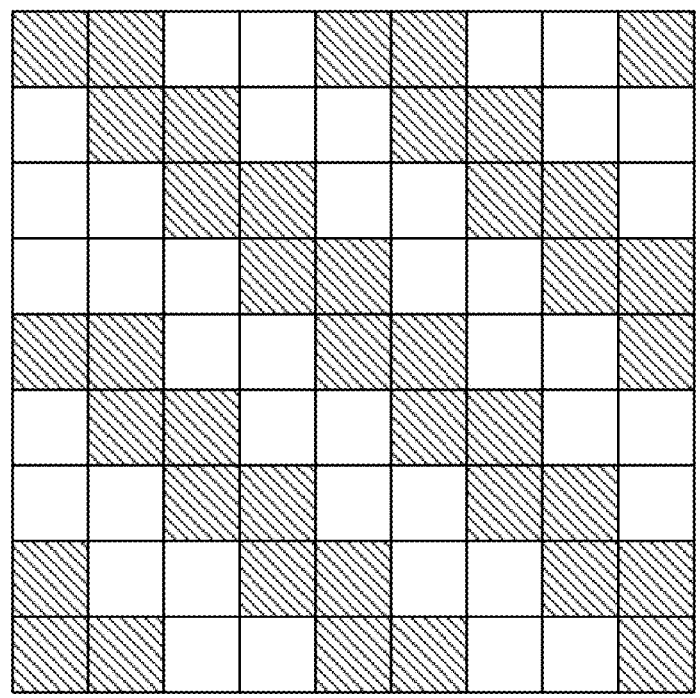
FIG. 8 shows an example of a patterned retarder having another striped pattern.
Figure 11:
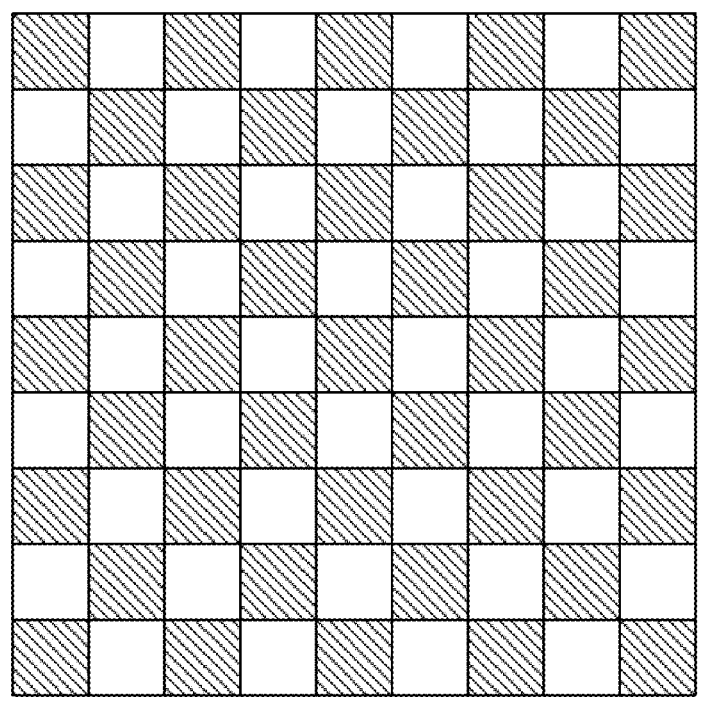
FIG. 11 shows an example of a patterned retarder having a checkerboard pattern.

It may be desirable to form the retarder to have two types of regions (e.g., shown as open and shaded in FIGS. 6, 8, and 11) such that for a type-1 region the arc angle between the representation points on the (normalized) Poincaré sphere of (A) the polarization state of the corresponding laser beam at the entrance side and (B) the polarization state of the laser beam at the exit side is 180 degrees different from the type-2 region arc angle (within an error of, for example, one, two, five, or ten percent). (Such description of polarization state in terms of representation points on a Poincaré sphere is well-known in the art and is described, e.g., in 'Polarized Light, fundamentals and applications', E. Collett, Marcel Dekker Inc.) For example, it may be desirable to form the retarder to preserve the polarization state in type-1 regions and to function, in type-2 regions, to change the polarization state of an incident beam to the orthogonal polarization state (e.g., to rotate the polarization direction of the linear polarized beam by ninety degrees). In other words, it may be desirable to form the retarder to function in type-2 regions as a half-wave plate (i.e., to have a retardance of a half wavelength) whose fast axis is rotated by 45 degrees relative to the plane of polarization of the incident beam.

In brief, the exit polarization at type-1 regions ("first pattern elements") is orthogonal (if ê1 represents the complex unit vector of a general elliptically polarized field, the orthogonal polarization is given by the vector product of the propagation direction with the complex conjugate; the inner product of ê1 with the complex conjugate of the orthogonal polarization is zero) with the exit polarization at type-2 regions ("second pattern elements"). In case of linear polarization, this means e.g. that the difference in the induced rotation angle of the linear polarization by the first pattern elements and the induced rotation of the linear polarization angle by the second pattern elements is pi/2. As one example in case of circular polarization, the first pattern elements create a left-handed circularly polarized beam, while the second pattern elements create a right-handed circularly polarized beam.

The pattern of the retarder may be a striped pattern (e.g., as in FIGS. 6 and 8), a checkerboard pattern (e.g., as in FIG. 11), or any other structure that results in a globally spatially uniform distribution of the polarization over the area of the beam. For example, it may be desirable to use a pattern that maximizes the spatial uniformity of the distribution of the polarization for each wavelength and for each polarization state, given the particular source arrangement. FIG. 5 shows a portion of a cross-section of an example of the retarder at a boundary between a type-1 region (which is configured to preserve the polarization state of the transiting beam) and a type-2 region (which is configured to change the polarization state of the transiting beam to the orthogonal polarization state). The different regions may be formed, for example, by selective deposition (e.g., as shown in FIG. 5) or by forming regions of one type apart from regions of another type (e.g., on different original substrates) and then assembling the different region elements on a common substrate. A patterned retarder may also be formed to have regions of more than two types (e.g., for more than two different relative retardance angles across the retarder) and/or to produce beams of different elliptical polarization states, to produce left-circularly polarized beams from type-1 regions and right-circularly polarized beams from type-2 regions (or vice versa), etc.

In another example, the patterned retarder is implemented using a liquid crystal element (e.g., made of a smectic, ferroelectric, nematic, or TN liquid crystal material), wherein different voltages are applied to different regions of the element to produce the array of pattern elements having the different polarization effects as described above.

Figure 7:
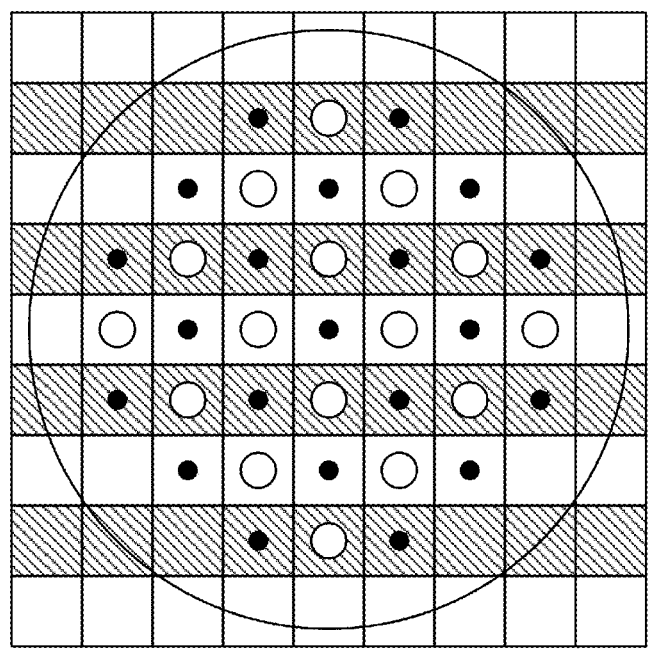
FIG. 7 shows an example of the striped retarder of FIG. 6 as applied to the combined beam of FIG. 1.
Figure 9:
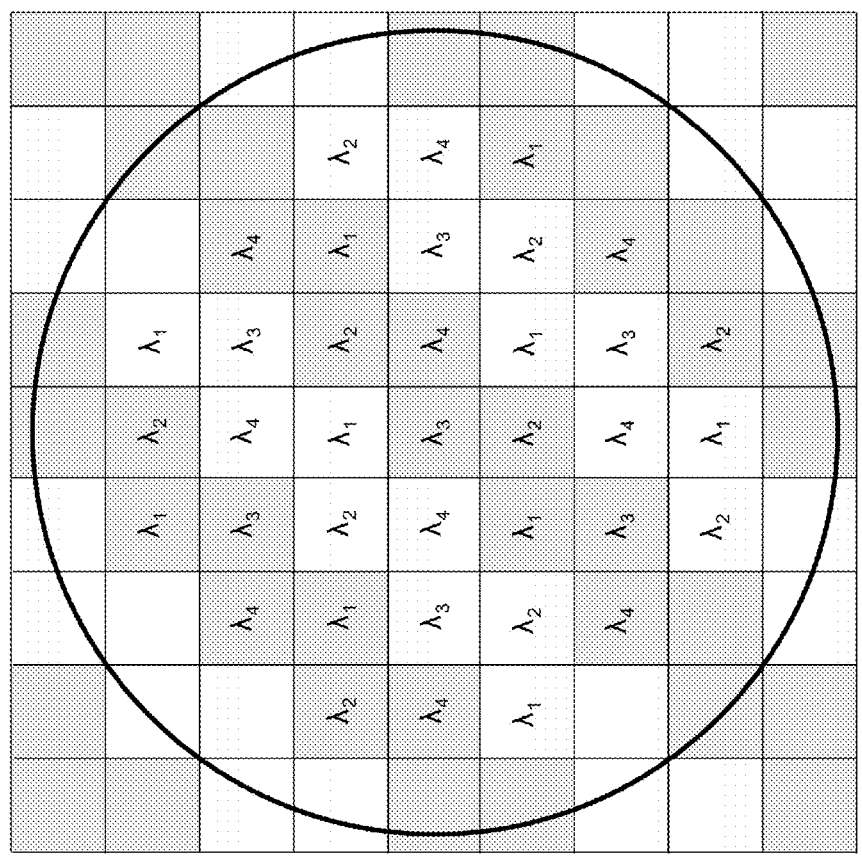
FIG. 9 shows an example of the striped retarder of FIG. 8 as applied to the combined beam of FIG. 2.
Figure 10B:
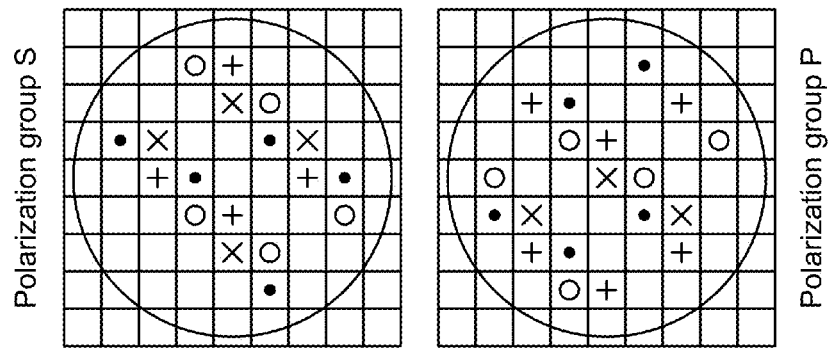
FIG. 10B shows the spatial distributions of the two polarization groups in the example of FIG. 10A.
Figure 10A:
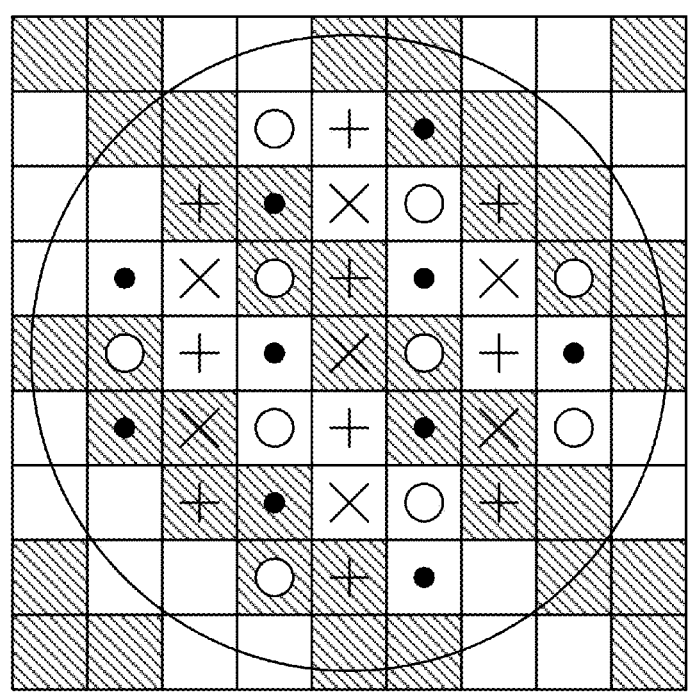
FIG. 10A shows the same example as FIG. 9, with the source labeling as in FIG. 3
Figure 12B:
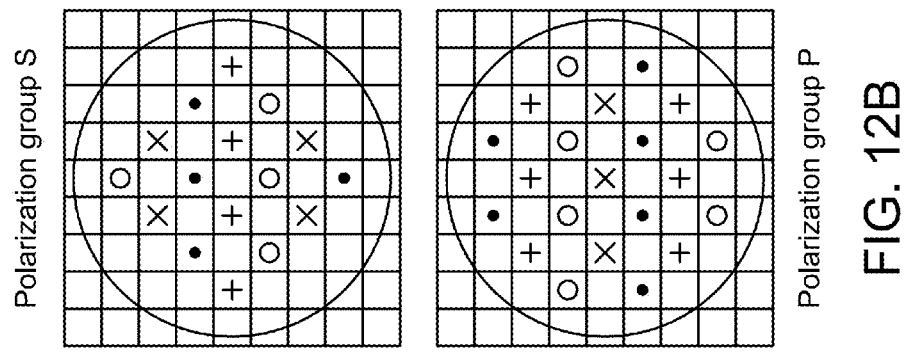
FIGS. 12A, 12B show diagrams analogous to FIGS. 10A, 10B for the checkerboard retarder of FIG. 11.
Figure 12A:
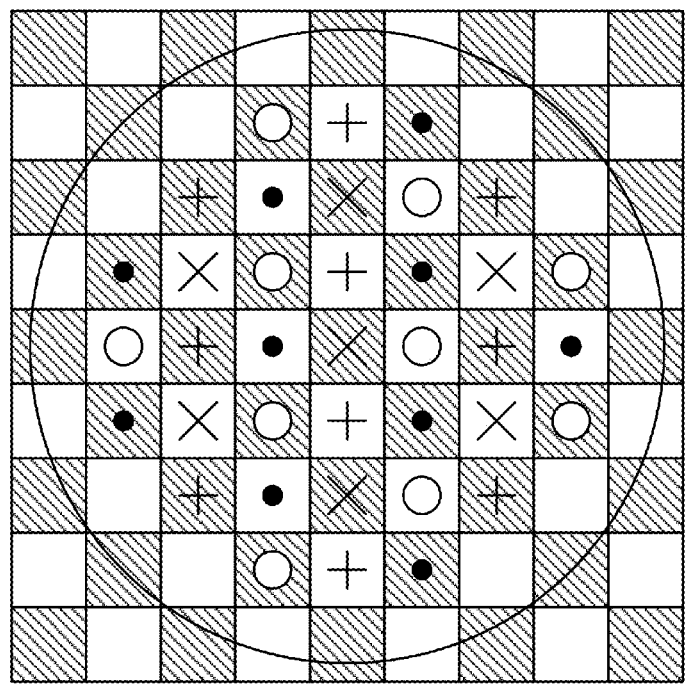

The dimensions of the pattern elements (regions) may be selected according to (e.g., to match) the pitch of the component beams of the combined laser beam. In one example, each region of the patterned retarder is a rectangle having lateral dimensions of about one centimeter by one centimeter, corresponding to a pitch of one centimeter between the centers of closest adjacent component beams of the combined beam. FIG. 7 shows an example of the striped retarder of FIG. 6 as applied to the combined beam of FIG. 1. FIG. 9 shows an example of the striped retarder of FIG. 8 as applied to the combined beam of FIG. 2. FIG. 10A shows the same example as FIG. 9, with the source labeling as in FIG. 3, and FIG. 10B shows the spatial distributions of the two polarization groups in this example. FIGS. 12A, 12B show similar diagrams for the checkerboard retarder of FIG. 11. In another example, it may be desirable to configure the pattern elements to be longer in one surface dimension than the other (e.g., corresponding to an asymmetry of the cross-sections of the incident beams as noted above).

Figure 13B:
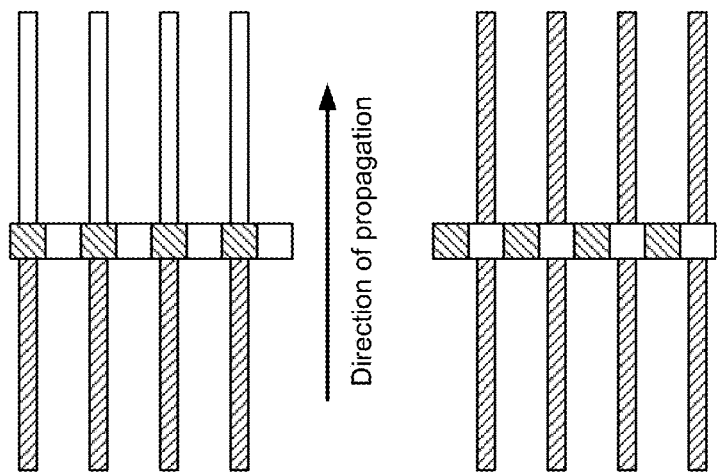
FIG. 13B shows an example of selective source activation to produce beams of different polarization states.
Figure 13A:
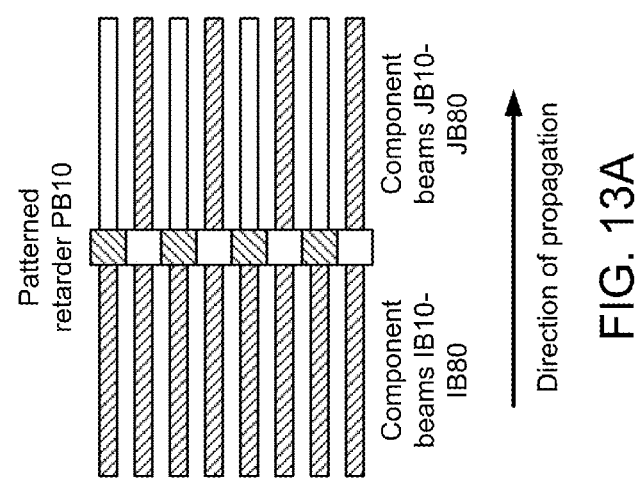
FIG. 13A shows a side view of an example a patterned retarder PR10 in use with a combined beam having component beams IB10-IB80.

FIG. 13A shows a side view of an example of a patterned retarder PR10 in use with a collimated combined beam. The patterned retarder is aligned with the combined beam such that each component beam is incident on only a corresponding section of the patterned retarder. (It will be understood that manufacture of elements of the pattern upon which no beam will be incident is optional.) For some of the pattern elements (e.g., type-1 regions, shown as open boxes), transit of the beam through the element does not appreciably affect the beam polarization. For other pattern elements (e.g., type-2 regions, shown as shaded boxes), transit of the beam through the element changes the beam polarization to its orthogonal state. In another example, the retarder is configured to reflect rather than to transmit beams, with the same effect that the difference between polarization angles of the incident and reflected beams is dependent upon the type of the corresponding retarder region, as described above.

One potential advantage of such an arrangement is that the whole laser source array can now be used in a polar-3D mode or in a color-3D mode to generate 3D stereo images:

1: Polar 3D with Polarization Conservation Through the Optical Engine.

For each of the laser sources, it is known whether the polarization of the corresponding emitted beam will be changed by the patterned retarder or not. In order to obtain the images with orthogonal polarization states for the right and left eye, therefore, it is sufficient to switch between the two polarization groups of laser sources (e.g., in synchronism with a light valve of the projector). FIG. 13B shows such an example. In the top diagram, sources corresponding to a polarization group S of the retarder are activated, producing a combined beam of a first polarization state (e.g., for a left-eye image). In the bottom diagram, sources corresponding to a different polarization group P of the retarder are activated, producing a combined beam of a second polarization state that is orthogonal to the first polarization state (e.g., for a right-eye image).

For an engine that includes two or more source arrays for each primary (e.g., as shown in FIG. 18), it may be desirable to perform this switching by activating, for each primary and for each array, the sources for only the corresponding polarization group. In this manner, wavelength diversity may be maximized (e.g., such that in each polarization state, all wavelengths are used) in order to reduce speckle as much as possible. It may be desirable in such case to design the patterned retarders for each source array to produce a beam for each polarization group (e.g., groups S and P as shown in FIG. 10B or FIG. 12B) that is spatially complementary in its component beams to the beam produced for the same polarization group by the other source array. In this manner, a combined beam whose intensity is maximally uniformly distributed over its cross-section may be obtained. Such switching may also be achieved by other optical or electromechanical means (e.g., a liquid crystal element or other spatial light modulator, an electromechanical or piezoelectric shutter, etc.).

2: Polar 3D without Polarization Conservation Through the Optical Engine.

Constructing the optical engine and/or the projector to conserve the polarization state of a beam may add complexity to the optical design. In a projector, polarization losses can be caused by birefringence of glass under stress (thermal and/or mechanical stress) and/or by reflection from surfaces. Such loss may result in a partially polarized light beam, which may be expected to lead to higher speckle contrasts and potentially to non-uniformities in brightness and color.

Figure 14:
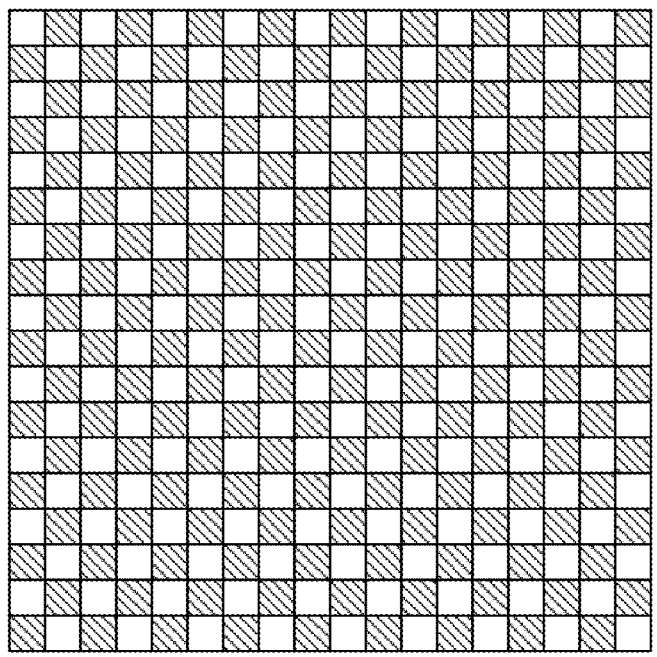
FIG. 14 shows an example of a patterned retarder having a reduced pitch.

In this case, the structure of the patterned retarder can be such that the pattern has a smaller pitch than the combined beam: each component beam passes through (alternatively, is reflected from) different sections of the patterned retarder. For example, the retarder may be formed so that each component beam passes through sections that affect the beam polarization differently. FIG. 14 shows one example of such a patterned retarder, and FIG. 15A shows such a retarder as applied to the combined beam of FIG. 3. The resulting component beams JB10-JB80 (and the combined beam) will then be unpolarized, as illustrated in FIG. 15B. This approach can be used in combination with an external polarizer and polarization switcher system to polarize the beam in one polarization state for images for the left eye and to polarize the beam in the orthogonal polarization state for images for the right eye.

3: Color 3D.

In this mode, respective images for the left and right eyes are obtained by a synchronized switching between the two ranges of wavelengths for each of the primaries. Due to the patterned retarders, also polarization diversity is maximally used to reduce speckle. In addition, the wavelength diversity within one range of wavelengths is also exploited.

3D modes 1 and 3 are equally efficient and do not require moving elements, reducing in this way the blanking period when switching from the left to the right eye. In addition, the switching can occur at higher frequencies, which allows higher frame rates and which tends to reduce eye strain.

Figure 16:
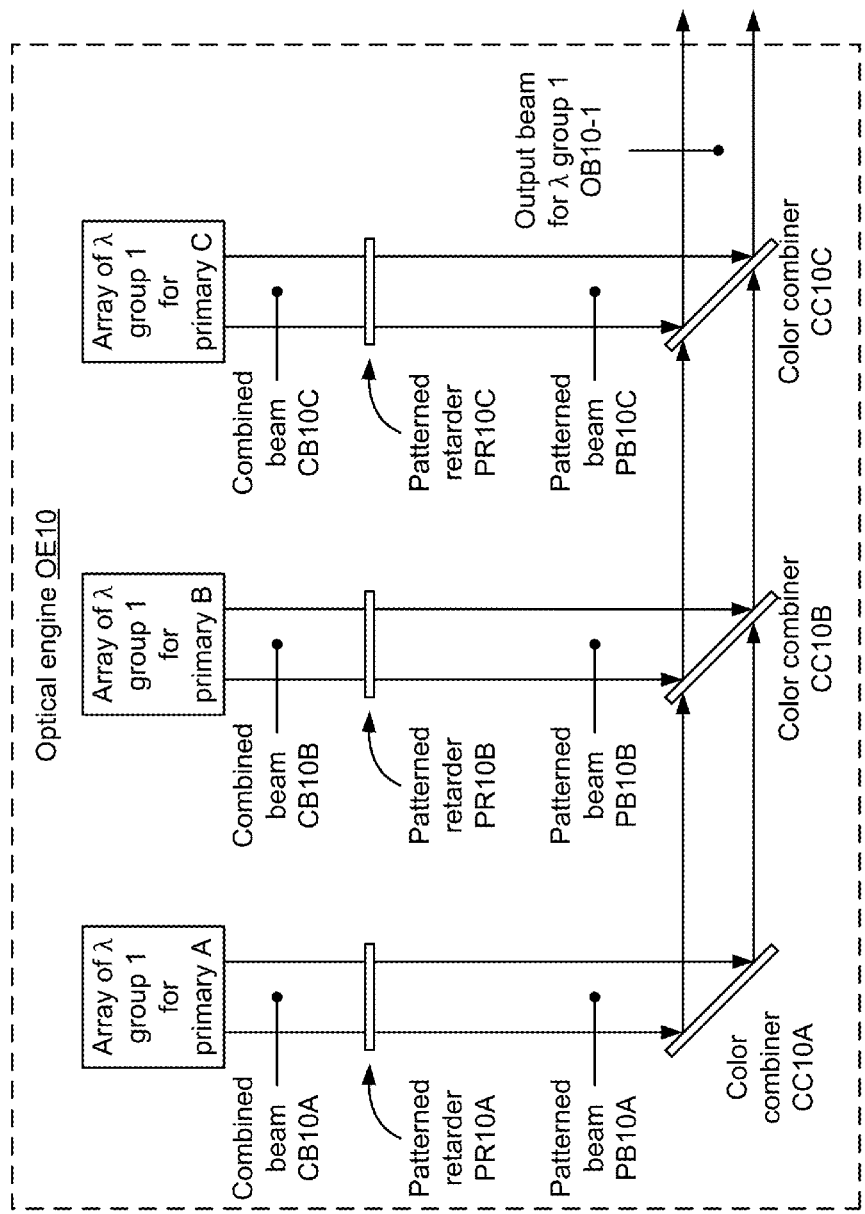
FIG. 16 shows a schematic diagram of a three-primary optical engine OE10.

FIG. 16 shows a schematic diagram of a three-primary optical engine OE10 that indicates the locations of the patterned retarders PR10A-PR10C in the optical path. In this example, it will be understood that each array will likely include collimating lenses and possibly other directing optics (e.g., mirrors and/or prisms) to produce the corresponding combined beams CB10A-CB10C. The patterned primary beams are combined using color combiners CC10A-CC10C. Such a combiner may be a mirror having a dichroic surface coating, for example, that passes light of one color (wavelength) and reflects light of another color. FIG. 17A shows an example of another optical combining path for such an engine. It is also noted that relay optics may be used between stages of the optical engine and/or between engine OE10 and projector PJ10.

FIG. 17B shows an example of combining patterned beams from two multi-primary paths, whose wavelengths (colors) may be orthogonal in frequency, to obtain an output beam for projection. FIG. 18 shows a diagram of such an implementation OE20 of optical engine OE10 that includes a color combiner CC10M arranged to combine the beams from the two multi-primary paths.

The foregoing presentation of the described embodiments is provided to enable any person skilled in the art to make or use the methods and other structures disclosed herein. Unless indicated otherwise, any disclosure of an operation of an apparatus having a particular feature is also expressly intended to disclose a method having an analogous feature (and vice versa), and any disclosure of an operation of an apparatus according to a particular configuration is also expressly intended to disclose a method according to an analogous configuration (and vice versa). The flowcharts and other structures shown and described herein are examples only, and other variants of these structures are also within the scope of the disclosure. Various modifications to these embodiments are possible, and the generic principles presented herein may be applied to other embodiments as well. Thus, the present invention is not intended to be limited to the embodiments shown above but rather is to be accorded the widest scope consistent with the principles and novel features disclosed in any fashion herein, including in the attached claims as filed, which form a part of the original disclosure.

What is claimed is:

1. An apparatus for producing a laser beam, said apparatus comprising:
    a patterned retarder comprising a plurality N of pattern elements; and
    a plurality N of laser sources, each configured to produce a corresponding laser beam,
    wherein each of the plurality N of laser sources is arranged to direct the corresponding laser beam to radiate onto an entrance side of a corresponding one of the pattern elements and to exit from an exit side of the pattern element,
    wherein the plurality N of pattern elements includes a plurality of first pattern elements and a plurality of second pattern elements, and
    wherein, for each of the plurality of first pattern elements, variation of an arc angle between representation points on a Poincaré sphere of (A) a polarization state of the corresponding laser beam at the entrance side and (B) a polarization state of the corresponding laser beam at the exit side is within ten percent of a value P1, and
    wherein, for each of the plurality of second pattern elements, variation of an arc angle between representation points on the Poincaré sphere of (A) a polarization state of the corresponding laser beam at the entrance side and (B) a polarization state of the corresponding laser beam at the exit side is within ten percent of a value P2, and
    wherein a difference between the value P1 and the value P2 is pi radians.

2. The apparatus according to claim 1, wherein, for at least one among the plurality of first pattern elements, the polarization state of a laser beam exiting the first pattern element is linear with an orientation perpendicular to an orientation of linear polarized light of a laser beam exiting at least one among the plurality of second pattern elements of the patterned retarder.

3. The apparatus according to claim 1, wherein, for at least one among the plurality of first pattern elements, the polarization state of a laser beam exiting the first pattern element is circular with opposite handedness to circular polarized light of a laser beam exiting at least one among the plurality of second pattern elements of the patterned retarder.

4. The apparatus according to claim 1, wherein a cross-section of each of the plurality N of laser beams is at least twice as long along a first direction than along a second direction that is orthogonal to the first direction.

5. The apparatus according to claim 1, wherein a surface plane of the pattern retarder is perpendicular to a first propagation direction, and
    wherein a propagation direction of each of the plurality N of laser beams is parallel to the first propagation direction.

6. The apparatus according to claim 1, wherein a difference between a first wavelength $\lambda 1$ and a second wavelength $\lambda 2$ is at least 0.5 nanometers and not greater than five nanometers, and
    wherein the plurality of N laser sources includes a first plurality of laser sources configured to produce beams having the first wavelength and a second plurality of laser sources configured to produce beams having the second wavelength.

7. The apparatus according to claim 6, wherein the first plurality of laser sources includes a source arranged to direct a beam onto one among the plurality of first pattern elements and a source arranged to direct a beam onto one among the plurality of second pattern elements, and
    wherein the second plurality of laser sources includes a source arranged to direct a beam onto one among the plurality of first pattern elements and a source arranged to direct a beam onto one among the plurality of second pattern elements.

8. The apparatus according to claim 1, wherein each of said plurality of first pattern elements comprises a nanolaminate.

9. The apparatus according to claim 1, wherein said plurality of first pattern elements is arranged relative to said plurality of second pattern elements in one among a striped pattern and a checkerboard pattern.

10. The apparatus according to claim 1, wherein said patterned retarder comprises a second plurality N of pattern elements, and
    wherein each of the plurality N of laser sources is arranged to direct the corresponding laser beam to radiate onto an entrance side of a corresponding one of the second plurality N of pattern elements at the same time as onto the entrance side of the corresponding one of the first plurality N of pattern elements.

11. The apparatus according to claim 10, wherein said apparatus comprises a polarizer arranged downstream of said pattern retarder in a path of said beams exiting the patterned retarder, and
    wherein said polarizer is configured to polarize a beam that comprises said beams exiting the patterned retarder.

12. The apparatus according to claim 1, wherein, for each of the plurality of first pattern elements, said variation of the arc angle is within five percent of the value P1, and
    wherein, for each of the plurality of second pattern elements, said variation of the arc angle is within five percent of the value P2.

13. The apparatus according to claim 1, wherein, for each of the plurality of first pattern elements, said variation of the arc angle is within one percent of the value P1, and
    wherein, for each of the plurality of second pattern elements, said variation of the arc angle is within one percent of the value P2.

14. The apparatus according to claim 1, wherein said plurality N of laser sources includes a first laser source configured to produce a corresponding first laser beam and a second laser source configured to produce a corresponding second laser beam, and
    wherein, among said first laser beam and said second laser beam, only said first laser beam is incident on said patterned retarder during a left-eye time period, and
    wherein, among said first laser beam and said second laser beam, only said second laser beam is incident on said patterned retarder during a right-eye time period.

15. The apparatus according to claim 1, wherein said plurality N of laser sources includes a first laser source and a second laser source, and wherein said laser beam corresponding to the first laser source has a first wavelength, and wherein said laser beam corresponding to the second laser source has a second wavelength that is different than the first wavelength, wherein a difference between the first wavelength and the second wavelength is not greater than six nanometers.

16. The apparatus according to claim 1, wherein said patterned retarder includes a substrate that is common to said plurality N of pattern elements.

17. An apparatus for producing a laser beam, said apparatus comprising:

a first plurality of patterned retarders, each retarder corresponding to a different one of a plurality of primary colors;

a first plurality of laser source arrays, each array corresponding to a different one of the first plurality of patterned retarders and arranged to radiate a plurality of laser beams that are directed onto the corresponding retarder; and first color combining optics arranged to receive a combined beam from each of the first plurality of patterned retarders and to combine the received beams to produce a first multi-primary beam, wherein, for each of said first plurality of patterned retarders, an effect of the retarder on a polarization state of an incident beam is dependent on the location of the retarder upon which the beam is incident, and wherein said first plurality of patterned retarders includes a first patterned retarder comprising a plurality N of pattern elements, and wherein, for each of the plurality N of pattern elements, the laser source array corresponding to said first patterned retarder is arranged to direct a corresponding one of a plurality N of the plurality of laser beams to radiate onto an entrance side of the pattern element and to exit from an exit side of the pattern element, wherein the plurality N of pattern elements includes a plurality of first pattern elements and a plurality of second pattern elements, and wherein, for each of the plurality of first pattern elements, variation of an arc angle between representation points on a Poincaré sphere of (A) a polarization state of the corresponding laser beam at the entrance side and (B) a polarization state of the corresponding laser beam at the exit side is within ten percent of a value P1, and wherein, for each of the plurality of second pattern elements, variation of an arc angle between representation points on the Poincaré sphere of (A) a polarization state of the corresponding laser beam at the entrance side and (B) a polarization state of the corresponding laser beam at the exit side is within ten percent of a value P2, and wherein a difference between the value P1 and the value P2 is pi radians.

18. The apparatus according to claim 17, wherein said apparatus comprises:

a second plurality of patterned retarders, each retarder corresponding to a different one of the plurality of primary colors; and a second plurality of laser source arrays, each array corresponding to a different one of the second plurality of patterned retarders and arranged to radiate a plurality of laser beams that are directed onto the corresponding retarder;

second color combining optics arranged to receive a combined beam from each of the second plurality of patterned retarders and to combine the received beams to produce a second multi-primary beam; and third color combining optics arranged to combine the first and second multi-primary beams to produce a combined multi-primary beam, wherein, for each of said second plurality of patterned retarders, an effect of the retarder on a polarization state of an incident beam is dependent on the location of the retarder upon which the beam is incident.

19. The apparatus according to claim 18, wherein during a left-eye time period, the first and second pluralities of laser source arrays are controlled such that each of the first and second multi-primary beams contain only beams having a first polarization state, and wherein during a right-eye time period, the first and second pluralities of laser source arrays are controlled such that each of the first and second multi-primary beams contain only beams having a second polarization state orthogonal to the first polarization state.

20. The apparatus according to claim 17, wherein
each of the plurality of first pattern elements and
each of the plurality of second pattern elements is formed to induce said corresponding variation.

\* \* \* \* \*